United States Patent [19]
Van Landingham

[11] 4,221,976
[45] Sep. 9, 1980

[54] TRANSISTOR SLOPE REVERSING CIRCUIT FOR DIGITAL CLOCK DISPLAY BRIGHTNESS CONTROL

[76] Inventor: Kenneth E. Van Landingham, 3220 Auten Rd., Ortonville, Mich. 48462

[21] Appl. No.: 894,490

[22] Filed: Apr. 7, 1978

[51] Int. Cl.$^2$ .............................................. H03K 6/04

[52] U.S. Cl. .................................... 307/230; 307/311; 307/236

[58] Field of Search ............... 307/229, 230, 280, 262, 307/263, 311, 236

[56] References Cited

U.S. PATENT DOCUMENTS 3,054,068 9/1962 De Jong .............................. 307/229

3,098,936 7/1963 Isabeau ........................... 307/280 X

*Primary Examiner*—John S. Heyman
*Attorney, Agent, or Firm*—Harry R. Dumont

[57] ABSTRACT

A circuit which utilizes a single transistor and a particular resistor combination to form a new slope reversing circuit in which the output voltage is a function of the input voltage with a change of sign for a monotonically varying input voltage. The circuit is valid for a transistor having a high current gain operating in either the active transistor region or the saturated transistor region. The circuit is of particular value when used as a brightness control circuit for a light display used in conjunction with a digital clock for automobile use.

4 Claims, 3 Drawing Figures

FIG. 1
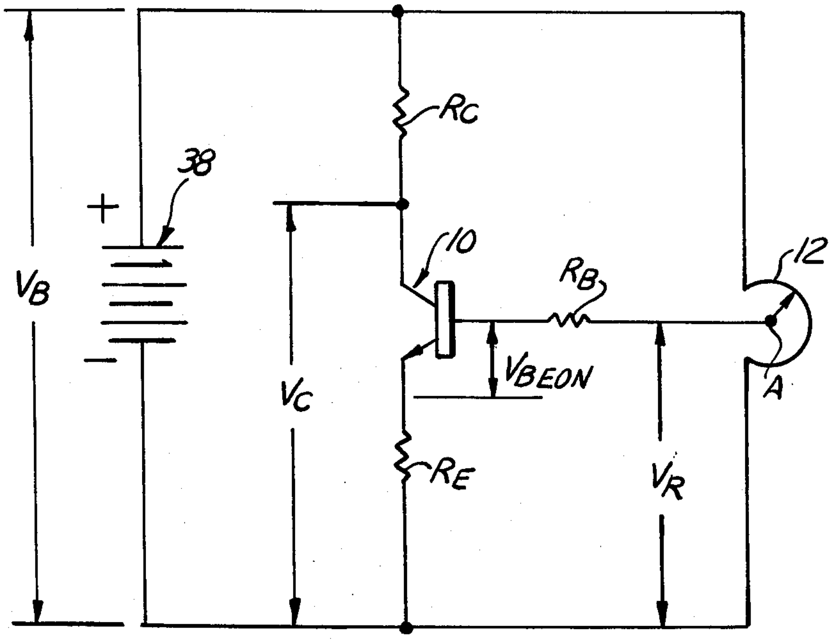
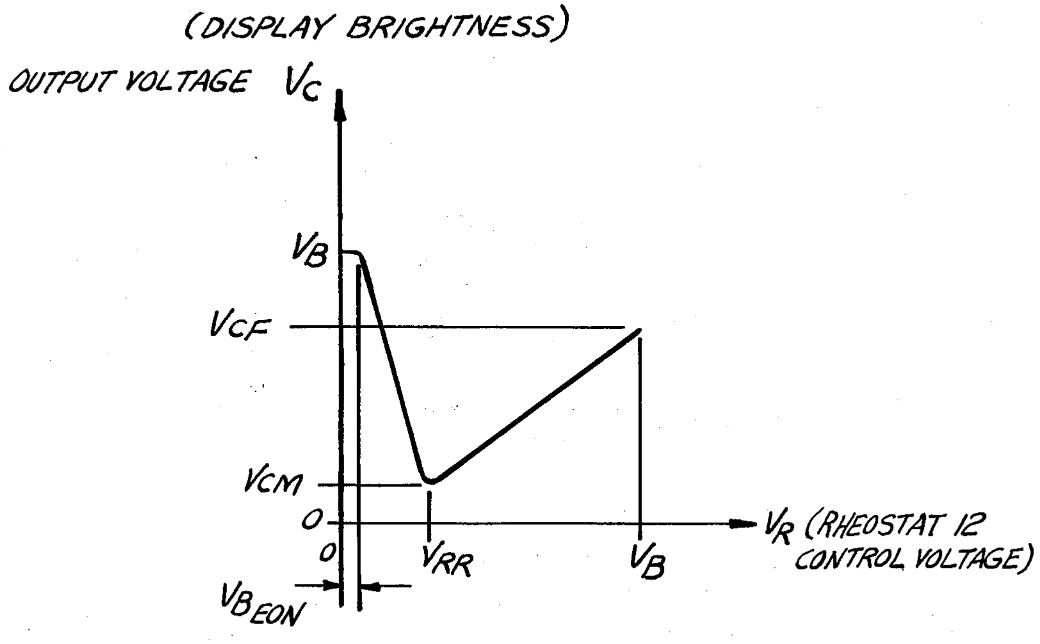
FIG. 2

TRANSISTOR SLOPE REVERSING CIRCUIT FOR DIGITAL CLOCK DISPLAY BRIGHTNESS CONTROL

BACKGROUND OF THE INVENTION

A problem exists with respect to digital clocks as used in automobiles which must have their display output brightness selectively varied in accordance with ambient light conditions. This adjustability must extend over a range of voltage greater than that normally used in the standard dashboard or headlight brightness adjustment circuits. It is further important that this adjustment of voltage be substantially linear throughout the adjustment range. The present invention will be seen to achieve these objectives and offer these advantages even though the circuit is a simple one employing a single transistor and two-terminal elements such that the circuit is economical to build and use. The circuit, it will be appreciated, has a large number of applications in addition to the one shown in the preferred embodiment.

BRIEF DESCRIPTION OF THE DRAWINGS

The present invention will be described in the appended specification and in the several drawings in which like numerals and letters are used to identify like elements as they may appear throughout the several different views:

FIG. 1 is a schematic showing the inventive circuit in a simplified form to illustrate its principles of operation;

FIG. 2 is a voltage waveform diagram illustrating the operation of the circuit of FIG. 1.

DESCRIPTION OF THE PREFERRED EMBODIMENT

Figure 3:
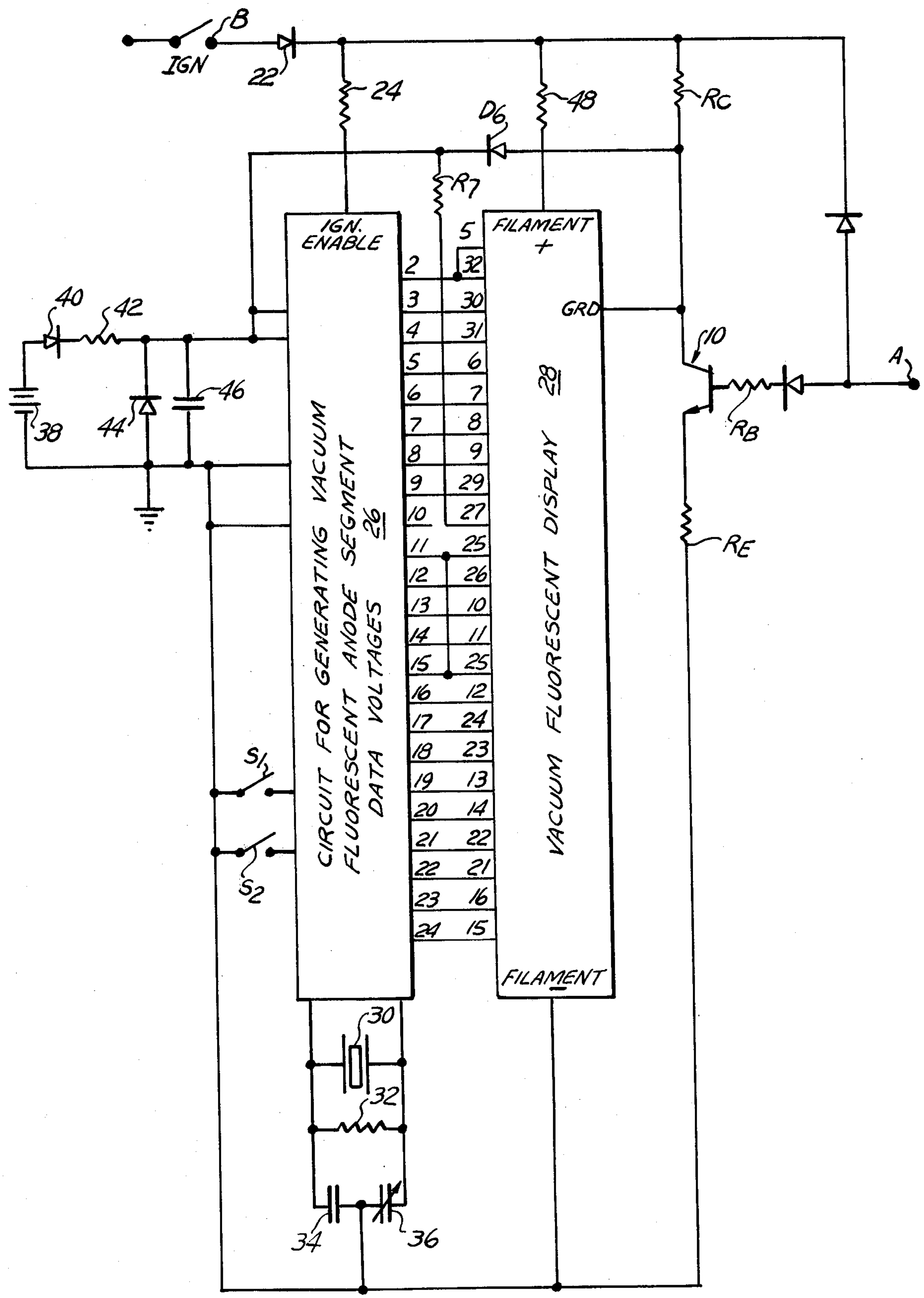
FIG. 3 is a combined schematic, block diagrammatic representation of the inventive circuit as it is included in a brightness control system including a digital clock and display therefore.

With reference to the FIG. 1 drawing, it includes a single NPN transistor 10 which is of the high current gain ($\beta$) type such that:

$$\beta >> 1$$

$$\beta + 1 >> \frac{R_B}{R_E}.$$

In the circuit of FIG. 1 the importance of the circuit and its operation is that the slope of the output voltage $V_C$ as a function of the input voltage $V_R$ as set, for example, by a rheostat 12 with a change of sign for a monotonically varying input voltage $V_R$. Mathematically this relationship is as follows:

$$\frac{dV_C}{dV_R} = \text{Negative for, } V_{BEON} \leqq V_R < V_{RR}$$

and $$\frac{dV_C}{dV_R} = \text{Positive for, } V_R > V_{RR}$$

where $V_{RR}$ is here defined as the value of input voltage, $V_R$ where slope reversal occurs as shown in FIG. 2.

Values of the final output voltage ($V_{CF}$), minimum output voltage ($V_{CM}$), and slope reversal voltage ($V_{RR}$) are design selectable by proper selection of values for $V_B$, $R_C$, $R_B$, and $R_E$. The following two approximate circuit equations aid in the selection of these values:

$$V_C = V_B + (V_{BEON} - V_R)\left(\frac{R_C}{R_E}\right) \quad (1)$$

$$V_C = \left(\frac{V_BR_B + V_RR_C - V_{BEON}R_C}{R_CR_B + R_ER_B + R_ER_C}\right)R_E \quad (2)$$

$V_{BEON}$ is given a nominal value of approximately 0.7 volts and represents the base emitter voltage of an ON (conducting) transistor.

Equation (1) represents the active transistor region given by:

$$V_{BEON} \leqq V_R < V_{RR}$$

Equation (2) represents the saturated transistor region given by:

$$V_R > V_{RR}$$

The above equations assume a high current gain ($\beta$) transistor such that:

$$\beta >> 1$$

$$\beta + 1 >> \frac{R_B}{R_E}.$$

FIG. 3 shows an automotive clock radio and display system in which the inventive circuit is included and is shown on the right hand side of the drawing. The input at the upper left hand side at terminal B represents a voltage input when the ignition switch is closed. The B+ voltage input from the ignition is passed through a diode 22 and a resistor 24 to the upper terminal "IGN enable" input terminal of a block diagram used to represent a digital clock circuit for generating vacuum fluorescent anode segment data voltages. The block is identified by the numeral 26. The block 26 may be embodied as a monolithic MOS integrated digital clock circuit utilizing P-channel low-threshold enhancement mode and ion-implanted depletion mode devices. One type of such device usable along with my invention is Model MM5377 manufactured and sold by the National Semiconductor Corporation, of Santa Clara, Calif. This circuit is interfaced directly with a vacuum fluorescent display 28 also shown in block form. At the lower end of block diagram 26 is shown a crystal oscillator 30 required for its operation. The frequency of operation of the crystal oscillator is selectively adjustable through a resistor capacitor network including a resistor 32, a capacitor 34 and a variable capacitor 36. The required DC supply is provided through a battery 38, diode 40, resistor 42 and a regulation zener diode 44 which in turn is shunted by a capacitor 46. At the left hand side of the digital clock 26 circuit are included a first switch $S_1$ for setting the hours and a second switch $S_2$ for setting the minutes. The direct interfacing between the two circuits includes a plurality of hour data outputs numbered 2 through 9, a colon output 10 and minute data outputs 11 through 24. It will be understood that a number of different vacuum fluorescent display circuits may be used. One which is suitable for incorporation in connection with my invention is commercial Model LD8164 which is a seven segment, four digit display panel that can indicate numerals 0 through 9 adding colons. This model is manufactured and sold by the Nippon Electric Company, Ltd., Tokyo, Japan. The brightness control is a function of the output voltage of the transistor 10 as shown in FIG. 3. The output voltage is labeled as $V_C$ in FIG. 1.

With respect to the system as shown in FIG. 3, the point $V_{RR}$ of FIG. 2 represents the minimum rheostat voltage as set by the rheostat 12 with the ignition switch on. $V_B$ represents the maximum rheostat voltage and also is substantially equal to the voltage output from the battery 38. It will be understood that the rheostat voltage is of 0 value with the ignition switch IGN off.

I claim:

1. A single transistor circuit for providing slope reversal of output voltage $V_C$ including a relatively high current gain NPN transistor operated in the saturated and active regions and having a variable input voltage $V_R$, a collector resistor $R_C$, an emitter resistor $R_E$ and a base resistor $R_B$; a DC source connected across said collector resistor and said emitter resistor and having a voltage magnitude $V_B$; said input voltage $V_R$ connected across said base resistor and said emitter resistor; said output voltage taken across the collector and the emitter resistor of said transistor; such slope reversal occurring at a magnitude $V_{RR}$ of said input voltage; such that $$V_R > V_{RR} \text{ and } V_C = \left( \frac{V_B R_E + V_R R_C - V_{BEON} R_C}{R_C R_B + R_E R_B + R_E R_C} \right) R_E$$

in the saturated region of said transistor; and $$V_{BEON} \leqq V_R < V_{RR} \text{ and } V_C = V_B + (V_{BEON} - V_R)\left(\frac{R_C}{R_E}\right)$$

in the active region of said transistor; wherein the quantity $V_{BEON}$ represents the base emitter voltage of said transistor in its "on" condition and wherein a data display filament voltage is connected across the collector and the emitter resistor $R_E$ of said transistor.

2. The combination as set forth in claim 1 wherein said data display is operably connected to the outputs of a digital clock control circuit for receiving time data inputs therefrom.

3. The combination as set forth in claim 2 wherein an ignition switch is operably connected to said data display and said digital clock control circuit for providing a DC source to both.

4. The combination as set forth in claim 2 wherein said variable input voltage $V_R$ is operatively controlled by a light dimmer rheostat.

* * * * *